US008084336B2

(12) United States Patent
White et al.

(10) Patent No.: US 8,084,336 B2
(45) Date of Patent: Dec. 27, 2011

(54) OSCILLATOR APPARATUS

(75) Inventors: Richard White, Cambridgeshire (GB); Jani Kivioja, Cambridgeshire (GB)

(73) Assignee: Nokia Corporation, Espoo (FI)

( * ) Notice: Subject to any disclaimer, the term of this patent is extended or adjusted under 35 U.S.C. 154(b) by 134 days.

(21) Appl. No.: 12/647,839

(22) Filed: Dec. 28, 2009

(65) Prior Publication Data

US 2011/0057734 A1    Mar. 10, 2011

Related U.S. Application Data

(63) Continuation-in-part of application No. 12/584,774, filed on Sep. 10, 2009, now Pat. No. 8,044,738.

(51) Int. Cl.
*H01L 21/20* (2006.01)
(52) U.S. Cl. ............... 438/478; 257/E21.131; 977/700
(58) Field of Classification Search ............... 438/478; 257/E21.131; 977/700, 732, 742
See application file for complete search history.

(56) References Cited

U.S. PATENT DOCUMENTS

| | | | |
|---|---|---|---|
| 6,424,074 B2 | 7/2002 | Nguyen | 310/309 |
| 6,709,929 B2 * | 3/2004 | Zhang et al. | 438/268 |
| 6,869,671 B1 * | 3/2005 | Crouse et al. | 428/304.4 |
| 7,488,671 B2 * | 2/2009 | Corderman et al. | 438/479 |
| 2006/0255790 A1 | 11/2006 | Gaillard et al. | 324/76.41 |
| 2008/0204152 A1 | 8/2008 | Feng et al. | 331/34 |
| 2010/0271003 A1 | 10/2010 | Jensen et al. | 324/76.49 |

FOREIGN PATENT DOCUMENTS

| | | |
|---|---|---|
| CN | 101143707 A | 3/2008 |
| WO | WO-2005112126 A1 | 11/2005 |
| WO | WO 2009/048695 A2 | 4/2009 |

OTHER PUBLICATIONS

Feng, X.L., C. J. White, A. Hijimiri, and M.L. Roukes (2008) A self-sustaining ultrahigh-frequency nanoelectromechanical oscillator Nat Nano 3(6), 342 (346).
Ayari, A.; Vincent, P.; Perisanu, S.; Choueib, M.; Gouttenoire, V.; Bechelancy, M.; Cornu, D. & Purcell, S. T.; "self—oscillations in field emission nanowire mechanical resonators: A Nanometric dc-ac Conversion", Nano Letters, 2007, 7, 2252-2257.
Jensen, K., K. Kim, and A Zetti (2008) An Atomic-Resolution Nanomechanical Mass Sensor, Nat Nano 3 (9), 533(537).
Jensen K., J. Welden, H. Garcia, and A. Zetti (2007), Nanotube Radio, Nano Lett. 7 (11), 3508(3511).

* cited by examiner

*Primary Examiner* — David Vu
(74) *Attorney, Agent, or Firm* — Harrington & Smith

(57) ABSTRACT

An apparatus including a resonator electrode and a second electrode separated from the resonator electrode by a gap having a size that facilitates electron transfer across the gap, wherein the resonator electrode is a resonator electrode mounted for oscillatory motion relative to the second electrode that results in a size of the gap between the resonator electrode and the second electrode being time variable; a feedback circuit configured to convey an electron transfer signal dependent upon electron transfer across the gap as a feedback signal; and a drive electrode adjacent the resonator electrode configured to receive a feedback signal from a feedback circuit configured to provide a time-varying feedback signal dependent upon electron transfer across a gap.

18 Claims, 4 Drawing Sheets

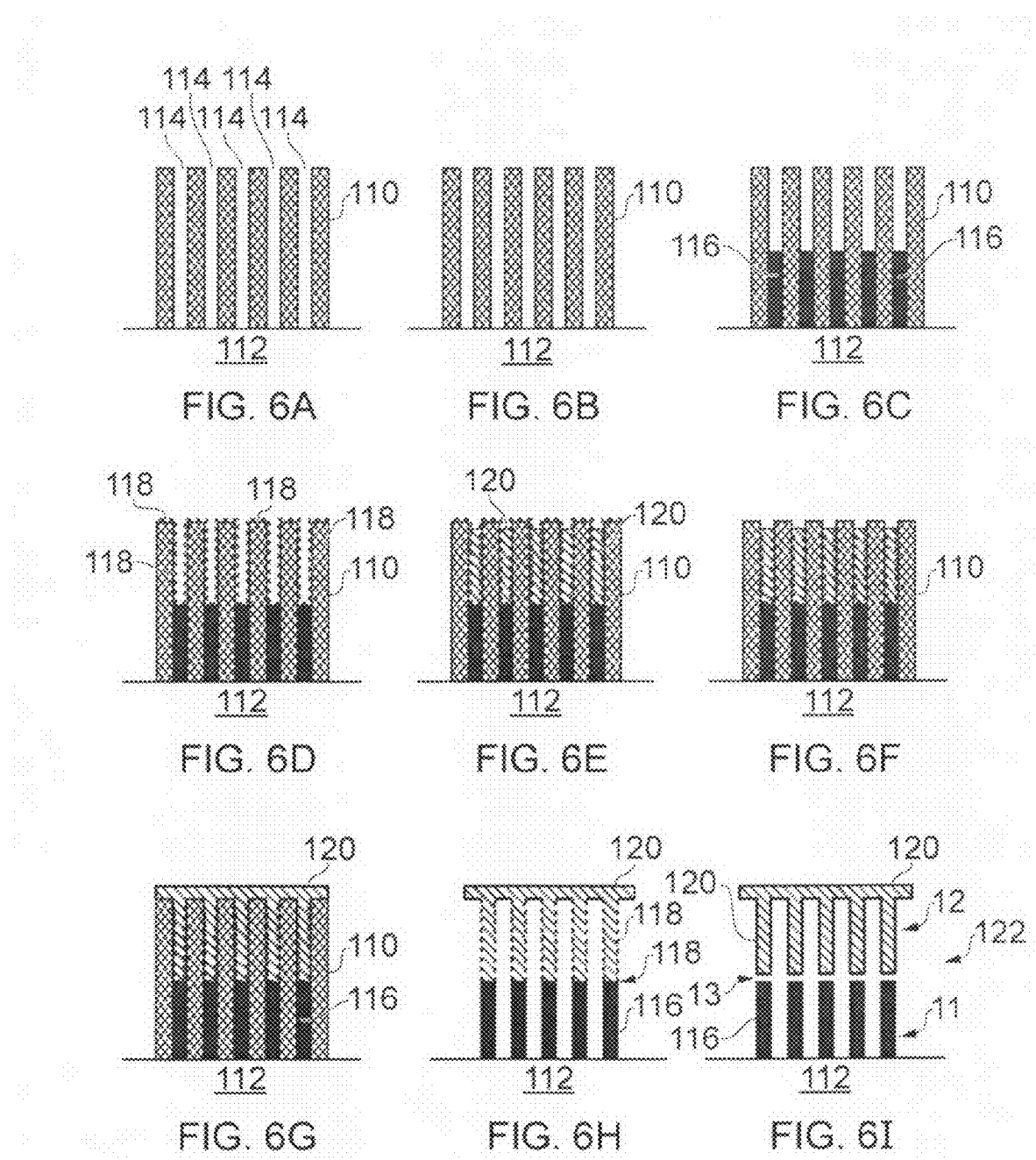

OSCILLATOR APPARATUS

CROSS-REFERENCE TO A RELATED PATENT APPLICATION

This patent application is a continuation-in-part of U.S. patent application Ser. No. 12/584,774, filed Sep. 10, 2009 now U.S. Pat. No. 8,044,738.

FIELD OF THE INVENTION

Embodiments of the present invention relate to an oscillator apparatus. In particular, an oscillator apparatus that uses an electro-mechanically produced positive feedback signal.

BACKGROUND TO THE INVENTION

An oscillator requires that a resonator is excited into oscillation. For oscillators without feedback, the losses (damping) associated with the oscillation means that a continuous oscillating driving signal at the frequency of oscillation or at some multiple of the operational frequency is required to maintain oscillation. However, when an oscillating signal produced by the oscillator itself is fed back to further excite the oscillator with appropriate amplification and phase control, then the oscillations can be sustained without the need for the oscillating driving signal.

BRIEF DESCRIPTION OF VARIOUS EMBODIMENTS OF THE INVENTION

According to various, but not necessarily all, embodiments of the invention there is provided an apparatus comprising: a first electrode and a second electrode separated from the first electrode by a gap having a size that facilitates electron transfer across the gap, wherein the first electrode is a resonator electrode mounted for oscillatory motion relative to the second electrode that results in a size of the gap between the first electrode and the second electrode being time variable; a feedback circuit configured to convey an electron transfer signal dependent upon electron transfer across the gap as a feedback signal; and a drive electrode adjacent the first electrode configured to receive a feedback signal from a feedback circuit configured to provide a feedback signal dependent upon electron transfer across a gap.

According to various, but not necessarily all, embodiments of the invention there is provided an apparatus comprising: a first electrode and a second electrode configured such that first relative motion of the first and second electrode vary a gap between the first and second electrodes; means for conveying an electron transfer signal dependent upon electron transfer across the gap; means for maintaining that a probability of electron transfer across the non-conductive gap is dependent on a distance across the gap; and means for changing a field through which first electrode moves in dependence upon a transfer signal.

According to various, but not necessarily all, embodiments of the invention there is provided a method comprising: conveying an oscillatory electron transfer current that is dependent upon electron transfer across a gap between a first oscillating electrode and a second electrode; and driving the first oscillating electrode using an oscillatory electron transfer current that is dependent upon electron transfer across a gap between a third oscillating electrode and a fourth electrode According to various, but not necessarily all, embodiments of the invention there is provided a method comprising: depositing first material in nanoscale channels of a template; depositing a nanoscale layer of a second material, different to the first material, in the nanoscale channels over the first material; depositing third material in the nanoscale channels over the second material; removing the template; and removing the nanoscale layer of second material.

BRIEF DESCRIPTION OF THE DRAWINGS

For a better understanding of various examples of embodiments of the present invention reference will now be made by way of example only to the accompanying drawings in which:

FIGS. 6A to 6I schematically illustrate an embodiment of the fabrication method.

DETAILED DESCRIPTION OF VARIOUS EMBODIMENTS OF THE INVENTION

Figure 1:
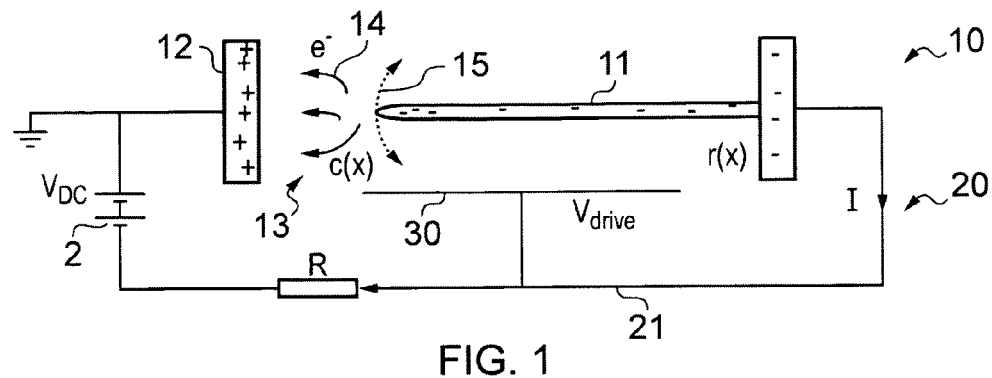
FIG. 1 schematically illustrates an apparatus comprising a single oscillator.

FIGS. 1 to 4 schematically illustrates an apparatus 10 comprising:
a first electrode 11 and a second electrode 12 separated from the first electrode 11 by a gap 13 having a size that facilitates electron transfer 14 across the gap 13, wherein the first electrode 11 is a resonator electrode mounted for oscillatory motion 15 relative to the second electrode 12 that results in a size of the gap 13 between the first electrode 11 and the second electrode 12 being time variable;
a feedback circuit 20 configured to convey an electron transfer signal (I) dependent upon electron transfer 14 across the gap 13 as a feedback signal 21; and
a drive electrode 30 adjacent the first electrode 11 configured to receive a feedback signal 21 from a feedback circuit configured to provide a feedback signal 21 dependent upon electron transfer across a gap.

Referring to FIG. 1, this Figure illustrates an apparatus 10 comprising a single oscillator. The drive electrode 30 adjacent the first electrode 11 receives the feedback signal 21 from the feedback circuit 20 (as opposed to a different feedback circuit associated with a different first electrode of a different oscillator).

The apparatus 10 comprises: a first resonator electrode 11, a second electrode 12 separated from the first electrode 11 by a gap 13, an electrical energy source 2 for providing a bias voltage across the gap 13 that facilitates electron transfer 14 across the gap 13, a feedback circuit 20 configured to convey an electron transfer signal (I) dependent upon electron transfer 14 across the gap 13 as a feedback signal 21, and a drive electrode 30 adjacent the first electrode 11 configured to receive the feedback signal 21 from the feedback circuit 20.

The first resonator electrode 11 is mounted for oscillatory motion 15 relative to the second electrode 12.

The first resonator may be a mechanically vibrating element. In the illustrated example it is a stiff cantilever. In other implementations the first resonator may use other oscillatory systems based upon physical distortion of a body such as, for example, surface distortions or waves or shape distortions of a three dimensional body In the illustrated example, the apparatus 10 is a nanoelectromechanical system (NEMS) because it has at least one dimension below 1 micron. For example, the width and height of the cantilever operating as the first electrode 11 have dimensions less than 1 micron.

In some embodiments, the width may range between 10 and 500 nm and in other embodiments widths outside this range may be used. In some embodiments, the length may range between 100 nm and 10 microns and in other embodiments lengths outside this range may be used. The geometry of the cantilever determines its fundamental resonant frequency.

The first resonator electrode 11 may be, for example, a nanowire e.g. doped silicon, metal, or carbon nanotube or a semiconductor nanowire.

The first resonator electrode 11 may be formed, for example, using a top-down and/or bottom up approach. A top-down approach uses chemical or physical processes to remove material to create a structure. A bottom-up approach synthesizes a structure by physical and/or chemical processes that self-assemble the structure.

In some embodiments, no external stimulus is required to set the first resonator electrode 11 into oscillatory motion. Thermal energy associated with the system is typically sufficient to set the first resonator electrode 11 into motion, with the major component of its motion being associated with its fundamental mode. In other embodiments independent stimuli may be used to set the first resonator electrode 11 into oscillatory motion.

The oscillatory motion 15 of the first electrode 11 relative to the second electrode 12 results in a size of the gap 13 between the first electrode 11 and the second electrode 12 being time variable. The size of the gap 13 changes as the first resonator electrode 11 oscillates.

The gap 13 between the first resonator electrode 11 and the second electrode 12 introduces a barrier between the first resonator electrode 11 and the second electrode 12. The gap may comprise a vacuum or a non-conductive medium. A non-conductive medium is a medium that requires the development of a significant potential difference across it before it conducts any electrons across it. There is no linear relationship between potential difference and current for small potential difference values. The non-conductive material may be a fluid. It may, for example, be a gas or gas mixture such as air or a liquid.

The electrical energy source 2 is configured to provide a potential difference across the gap 13. In the illustrated example, the electrical energy source is one or more battery cells which provide a substantially constant bias direct current (DC) voltage. The DC bias controls the amplitude of the AC electron transfer signal (I) and therefore allows control of the oscillator's transfer function, $H(j\omega_0)$, such that the Barkhausen criterion can be satisfied for self-sustained oscillation. The Barkhausen criterion is $H(j\omega_0)G(j\omega_0)=1$, where $G(j\omega_0)$ is the gain of the feedback loop and $H(j\omega_0)$ is the transfer function of the oscillator at resonant frequency $\omega_0$.

The combination of the potential difference across the gap 13 and the non-conductive gap 13 results in charge build up on the first electrode 11 and the second electrode 12. In the illustrated example, the first electrode is a cathode and the second electrode is an anode. The applied potential difference and the size of the gap are configured to provide an electric field that facilitates electron transfer 14 across the gap 13 at least as the gap narrows with movement of the first electrode 11.

The probability of electron transfer 14 across the gap 13 is dependent on the size of the gap as it is dependent upon the electric field required to overcome a potential barrier and liberate an electron from the material of the first electrode.

The potential barrier may be perceived as a property of the electrode material e.g. work function for field emission.

The potential barrier may be perceived as a property of the gap e.g. potential barrier in quantum mechanical tunneling The feedback circuit 20 is configured to convey the electron transfer signal (I) dependent upon electron transfer 14 across the gap 13 as a feedback signal 21 to the drive electrode 30.

The feedback circuit 20 is in this embodiment an 'internal feedback' circuit. This means that the feedback circuit 20 comprises an interconnect that has a path length that is of the same order of magnitude as the size of the first resonator electrode 11. That is, it is mesoscopic. In this embodiment, the interconnect does not travel to an external circuit which is at a different, macroscopic scale. However, in other embodiments. the feedback circuit may be an 'external feedback' circuit. This means that the feedback circuit 20 comprises an interconnect that travels to an external circuit which is at a different, macroscopic scale.

The drive electrode 30 is positioned adjacent and close to the first resonator electrode 11 but not in contact with the first resonator electrode 11. The drive electrode 30 develops an electric field between the first resonator element 11 and the drive electrode 30 that depends upon the feedback signal 21.

The surface area of the drive electrode 30 and its separation from the first resonator electrode 11 are configured so that there is sufficient capacitative coupling between the drive electrode 30 and the first resonator electrode 11. The greater the capacitance between the drive electrode 30 and the first resonator electrode 11, the greater the force exerted by the drive electrode on the first resonator electrode 11.

As the first resonator electrode 11 oscillates it produces an oscillatory feedback signal 21 which in turn produces an oscillatory force on the first resonator electrode 11 creating a positive feedback system that self-sustains oscillations of the first resonator electrode 11 without the need for an externally applied oscillating driving signal or external phase or gain control. Self-sustained oscillation is achieved when the feedback circuit parameters, largely controlled by the DC potential source, satisfy the Barkhausen criterion.

The mechanical impedance of the first resonator electrode 11 (stiffness of the cantilever) is small so that the energy provided by the electric field of drive electrode is sufficient to maintain oscillations.

The mechanical impedance of the first resonator electrode 11 (stiffness of the cantilever) may also be used to provide stabilization. For example, the stiffness of the cantilever is non-linear increasing in proportion to the cube of its displacement.

Figure 2:
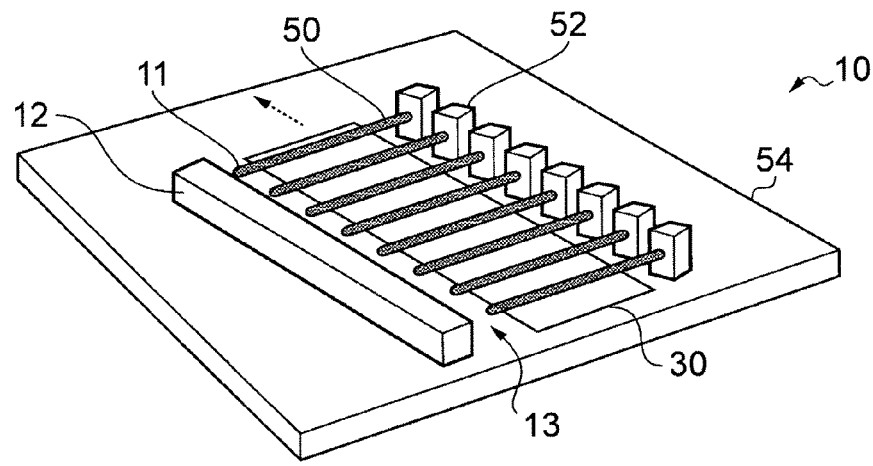
FIG. 2 schematically illustrates an apparatus comprising a plurality of oscillators having a shared drive electrode.

FIG. 2 illustrates an apparatus 10 comprising a plurality of oscillators.

Each oscillator comprises: a first resonator electrode 11, a second electrode 12 separated from the first electrode 11 by a gap 13, a feedback circuit 20 configured to convey an electron transfer signal (I) dependent upon electron transfer 14 across the gap 13 as a feedback signal 21, and a drive electrode 30.

The oscillators, in this example, share a common electrical energy source 2 for providing a bias voltage across the gap 13 that facilitates electron transfer 14 across the gap 13, The oscillators, in this example, share a common drive electrode 30 adjacent the first electrodes 11 of the oscillators configured to receive the feedback signals 21 from the feedback circuits 20 of the oscillators.

The feedback signals 21 from the separate oscillators are combined and the combined superposition of generated feedback signals is provided to the common drive electrode 30. This imposes coupling between individual oscillators such that synchronization between the oscillators can occur i.e. the first resonant electrodes 11 of the different oscillators can move in phase.

The first resonator electrodes 11 of the oscillators in the illustrated example are formed from separate nanowires 50 each of which is held in a cantilevered arrangement by a clamp 52 mounted on a substrate 54. The common drive electrode 30 and the common second electrode 12 are also mounted on the substrate 54.

The substrate 54 may, for example be formed from sapphire, glass, or oxidized silicon.

Figure 3:
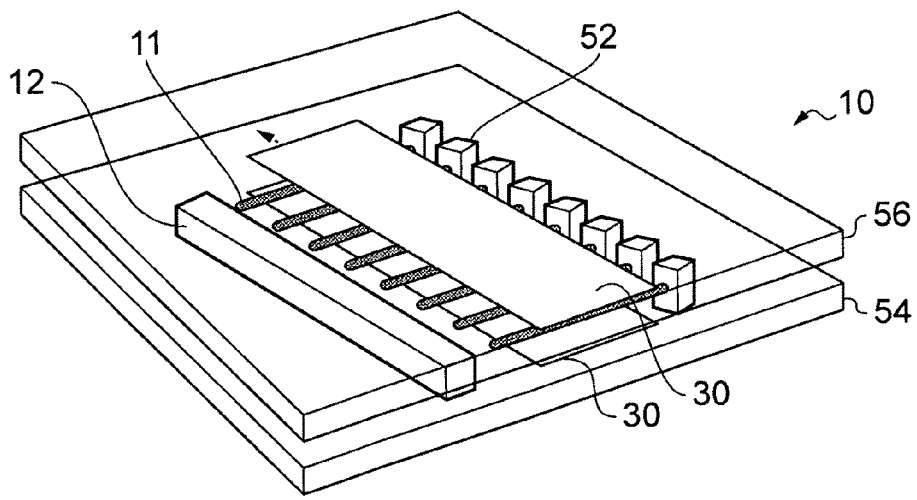
FIG. 3 schematically illustrates an apparatus comprising a plurality of oscillators having opposing shared drive electrodes.

FIG. 3 illustrates an apparatus 10 comprising a plurality of oscillators similar to that illustrated in FIG. 2. However, the apparatus not only has a bottom substrate 54 supporting a common drive electrode 30, it also has a top substrate 54 supporting a further common drive electrode 30.

The feedback signals 21 from the separate oscillators are combined and the combined superposition of generated feedback signals is provided to two opposing common drive electrodes 30 that are in phase with each other. This imposes coupling between individual oscillators such that synchronization between the oscillators can occur. Some of the first resonator electrodes 11 of the different oscillators can move in phase (driven by the same one of the two opposing drive electrodes) and others may move in anti-phase (driven by different ones of the two opposing drive electrodes). Each oscillator can be in phase or in anti-phase with each other oscillator within the array. I.e. each oscillator occupies one of two phase states.

Figure 4:
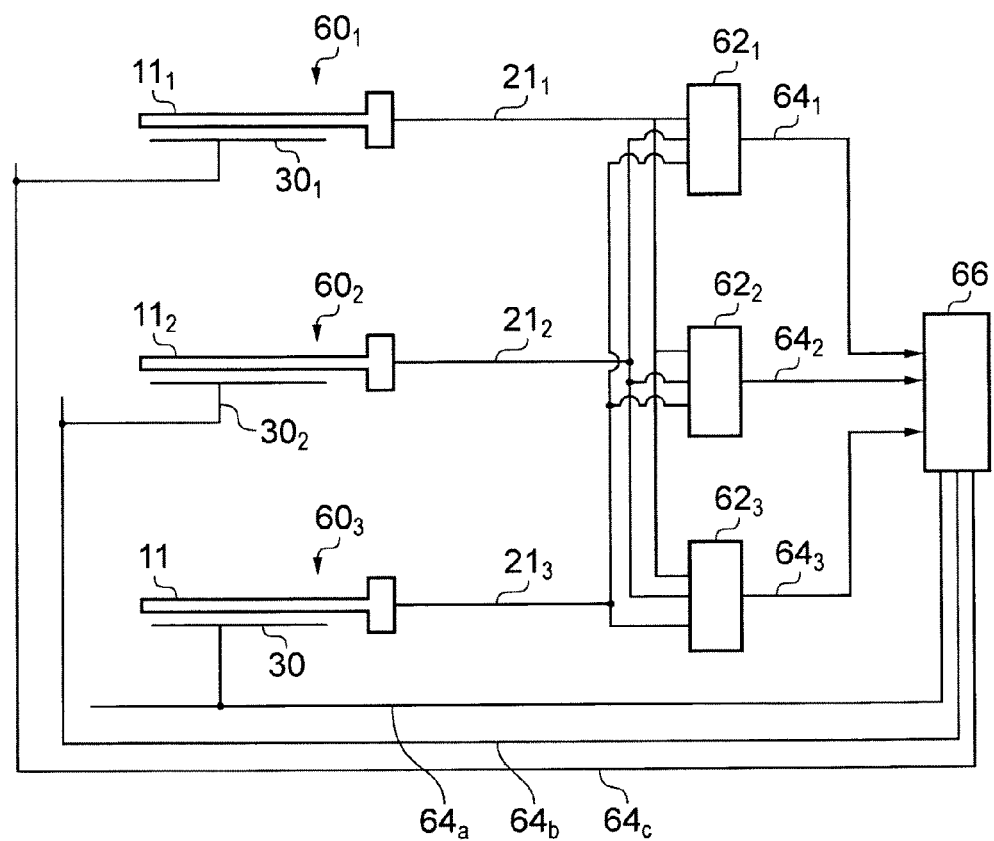
FIG. 4 schematically illustrates an apparatus comprising a plurality of oscillators and control circuitry including combination circuitry and routing circuitry.

FIG. 4 schematically illustrates an apparatus 10 comprising a plurality of oscillators $50_1$, $50_2$ and $50_3$ and control circuitry including the combination circuitry $62_1$ and the routing circuitry $66_3$.

Each oscillator $50_n$ comprises: a first resonator electrode $11_n$, a second electrode $12_n$ separated from the first electrode $11_n$ by a gap, a feedback circuit configured to convey an electron transfer signal (I) dependent upon electron transfer across the gap as a feedback signal $21_n$ and a drive electrode $30_n$ adjacent the first electrode $11_n$ configured to receive a feedback signal from a feedback circuit.

The plurality of feedback signals $21_1$, $21_2$ and $21_3$ are provided as inputs to first combination circuitry $62_1$. The first combination circuitry $62_1$ creates a summation of selected ones of its inputs and provides the summation as an output signal $64_1$. The summation may in some embodiments be selectively weighted.

The plurality of feedback signals $21_1$, $21_2$ and $21_3$ are provided as inputs to second combination circuitry $62_2$. The second combination circuitry $62_2$ creates a summation of selected ones of its inputs and provides the summation as an output signal $64_2$. The summation may in some embodiments be selectively weighted.

The plurality of feedback signals $21_1$, $21_2$ and $21_3$ are provided as inputs to third combination circuitry $62_3$. The third combination circuitry $62_3$ creates a summation of selected ones of its inputs and provides the summation as an output signal $64_3$. The summation may in some embodiments be selectively weighted.

Routing circuitry $66_3$ receives the plurality of output signals $64_1$, $64_2$, $64_3$ and selectively provides one of the plurality of output signals $64_1$, $64_2$, $64_3$ as feedback signal $64_a$ to the drive electrode $30_1$ of the first oscillator $60_1$, selectively provides one of the plurality of output signals $64_1$, $64_2$, $64_3$ as feedback signal $64_b$ to the drive electrode $30_2$ of the second oscillator $60_2$, and selectively provide one of the plurality of output signals $64_1$, $64_2$, $64_3$ as feedback signal $64_c$ to the drive electrode $30_3$ of the third oscillator $60_3$.

It is therefore possible to temporarily or permanently configure the apparatus 10 such that the drive electrode of a first oscillator $60_1$ is configured to receive a feedback signal $21_2$ from the feedback circuit of a second oscillator $60_2$.

It is therefore possible to temporarily or permanently configure the apparatus such that the drive electrode of a first oscillator $60_1$ is configured not to receive a feedback signal $21_1$ from the feedback circuit of the first oscillator $60_1$.

It is also possible to provide the same feedback signal 64 to a plurality of drive electrodes 30 of respective oscillators 60. The plurality of drive electrodes 30 then operate as a common drive electrode.

The combination circuitry $62_1$ and the routing circuitry $66_3$ are typically provided as external circuitry that is not integrated 'on-chip' with the oscillators. The size scale of the combination circuitry $62_1$ and the routing circuitry 66 is typically macroscopic, that is at a very much greater scale than that of the oscillators 60.

In the drawings and the foregoing description components may be illustrated and/or described as connected. It should be understood that components may instead be operationally coupled and that any number or combination of intervening elements can exist (including no intervening elements).

Applications of the apparatus 10 described in the preceding paragraphs include, but are not limited to: pattern recognition, data classification, radio-frequency electronics, signal processing, sensing, and encoding/decoding.

Figure 5:
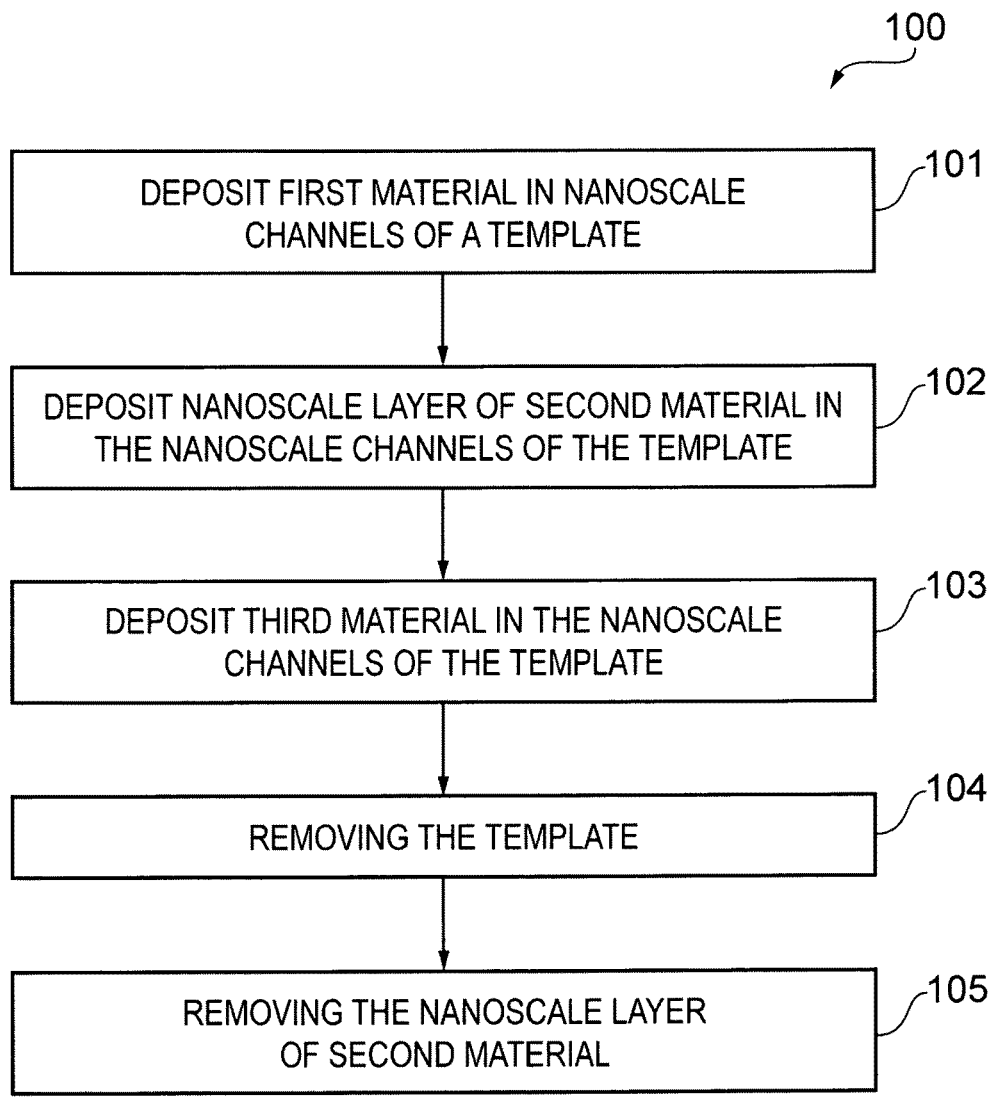
FIG. 5 schematically illustrate a fabrication method.

FIG. 5 schematically illustrates a templated fabrication method 100 suitable for fabricating first electrodes 11, second electrodes 12 and gaps 13 of the apparatus 10.

The method 100 comprises: depositing 101 first material in nanoscale channels of a template; depositing 102 a nanoscale layer of a second material, different to the first material, in the nanoscale channels over the first material; depositing 103 third material in the nanoscale channels over the second material; removing 104 the template; and removing 105 the nanoscale layer of second material.

FIGS. 6A to 6I schematically illustrates an embodiment of the method 100 suitable for templated synthesis of nanoresonator arrays comprising self-aligned first electrodes 11 and second electrodes 12 separated by gaps 13.

Referring to FIG. 6A, a template 110 is applied to a surface of a substrate 112.

In this example, the substrate 112 is epitaxial semiconductor however other substrates may be used.

In this example, the template 110 is anodic aluminum oxide, however, other templates may be used.

The template 110 has an array of nanoscale channels 114 that are open-ended and extend lengthwise through the template 110 in a direction orthogonal to the surface of the substrate 112 until they meet that surface of the substrate 112. Each of the channels 114 in this embodiment but not necessarily all embodiments, has a cross-sectional area that is substantially normal to its length. In this example, the cross-sectional area has a maximum span that is less than 100 nm but in other implementations the cross-sectional area may have a maximum span that is greater than 100 nm.

Under optimized and controlled anodization conditions, i.e. with the appropriate selection of anodizing electrolyte (incl. sulphuric, phosphoric, oxalic and chromic acids) and voltage, aluminum oxidizes as a porous material consisting of self-assembled array of uniformly sized parallel channels 114 with inherent localized hexagonally-close-packed order. The ordering of the channels 114 can be extended across an entire wafer by pre-patterning the aluminum layer using techniques such as focused-ion-beam milling, or interference lithography processes. The channel diameters can be varied from 4 to 300 nm. The parameters and anodization process can be modified in order to fully extend the channels 114 down to the underlying substrate 112.

Referring to FIGS. 6B and 6C, first material 116 is deposited in the nanoscale channels 114 of the template 110.

The first material 116 may be formed using, for example, vapor-phase growth such as vapor-liquid-solid (VLS) growth or electrochemical deposition. The first material 116 may be a semiconductor (e.g. silicon or zinc oxide), a doped semiconductor or a metal (e.g. gold or silver) depending on the specific application.

In this example, the first material is single crystalline semiconductor in epitaxial registration with the substrate 112. The semiconductor may be doped or intrinsic. The first material is deposited using vapor-liquid-solid (VLS) growth. Referring to FIG. 6B, a small amount of impurity metal (e.g. Au) is deposited through evaporation or electro-deposition to act as a catalyst for VLS growth. Referring to FIG. 6C, the VLS growth is carried out and the catalyst metal is etched away.

Referring to FIG. 6D, a nanoscale layer 118 of a second material, different to the first material, is deposited in the nanoscale channels 114 over at least the first material 116.

The second material 118 is deposited using atomic layer deposition (ALD). This technique generally forms a uniform conformal film everywhere on the sample where the film thickness is controllable with sub-nanometer precision.

Atomic layer deposition (ALD) is based on a cycle of successive, surface-bound reactions of gas-phase precursors. The arrangement is placed within the ALD reactor and the first precursor gas is introduced and forms a conformal monolayer. The reactor is purged to remove the first precursor from the chamber and then a second precursor is introduced which reacts with the monolayer of molecules deposited during the first phase of the cycle. The chamber is purged again and then the first precursor is reintroduced and so on. In this way, thin films with thickness accuracies, in principle, in the sub-nanometer range (as the thickness is a linear function of the number of cycles) with, in principle, perfect conformality and perfect controllability Materials that have been deposited using ALD include Al2O3, ZnO, TiO2, HfO2, SiO2, Pt, Ru and Ta.

In the Figures, the nanoscale layer 118 of second material is illustrated using a dashed line. It should be understood that this is for clarity of illustration. The nanoscale layer 118 is continuous.

The nanoscale layer 118 is sacrificial and is removed at a later stage. The nanoscale thickness of the layer 118 defines nanoscale electrode-electrode gaps 13.

The second material may be conductive. The thickness of the nanoscale layer may be less than 10 nm.

Referring to FIG. 6E, a third material 120 is deposited in the nanoscale channels 114 over the second material 118 at the bases of the open channels.

The third material 120 may be deposited using, for example, either vapor-liquid-solid growth or electro-deposition.

Depending on the application and the method of deposition, the deposition of the third material may extend beyond the channel 114 opening and may form a continuous layer above the template as illustrated in FIG. 6G. This continuous layer can serve as a static electrode for NEMS applications.

The third material may be deposited in two stages. A first stage as illustrated in FIG. 6E and a second stage as illustrated in FIG. 6G separated by a stage in which the second material 118 is milled from the exterior surface of the template as illustrated in FIG. 6F.

Referring to FIG. 6H, the template 110 is then removed, in this example using etching.

The third material 120 should be sufficiently stiff and sufficiently supported as it is important that this material which forms the static electrodes 12 does not bend under its own weight and make contact with the first material 116 which forms the oscillating electrodes 11.

Referring to FIG. 6I, the nanoscale layer 118 of second material is removed creating gaps 122 between the first material 116 and the third material 120. The second material 118 may be removed by selective etching.

The above described fabrication uses scalable self-assembly techniques without the need for time-consuming and expensive fabrication steps such as electron-beam lithography.

The final structure 122 illustrated in FIG. 6I comprises single-crystalline nanowire resonator electrodes 11 formed from the first material 116, vertically aligned with respect to the underlying conductive substrate 112 and separated from the top nanowire electrodes 12 formed from the this material 120 by gaps 13 which have been controlled to sub-nanometer precision.

The structure 122 comprises uniformly sized, uniformly spaced, vertically-aligned nanowires separated by collinear, self-aligned tunnel-junctions 13.

The electrodes 11 can be excited into mechanical resonance using, for example, a common drive electrode 30 such as, for example, a capacitive plate (not illustrated).

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method comprising:
    depositing first material in nanoscale channels of a template;
    depositing a nanoscale layer of a second material, different to the first material, in the nanoscale channels over the first material;
    depositing third material in the nanoscale channels over the second material;
    removing the template; and
    removing the nanoscale layer of second material.

2. A method as claimed in claim 1, wherein the template is removed by an etch and the nanoscale layer of second material is removed by a different etch.

3. A method as claimed in claim 1, further comprising applying the template to a surface of a substrate before depositing first material in nanoscale channels of the template.

4. A method as claimed in claim 3, wherein the substrate is epitaxial semiconductor.

5. A method as claimed in claim 1, wherein the template is anodic aluminum oxide.

6. A method as claimed in claim 1, wherein the channels have a cross-sectional area that is substantially normal to their longest dimension and the cross-sectional area has a maximum span that is less than 100 nm 7. A method as claimed in claim 1, wherein the channels are open-ended and extend through the template to a substrate.

8. A method as claimed in claim 1, wherein the first material is a semiconductor in epitaxial registration with a substrate supporting the template.

9. A method as claimed in claim 1, wherein the first material is a single crystalline material.

10. A method as claimed in claim 1, wherein the first material is a semiconductor or a doped semiconductor.

11. A method as claimed in claim 1, wherein depositing first material in nanoscale channels of a template uses vapor-liquid-solid growth of a semiconductor.

12. A method as claimed in claim 1, wherein the nanoscale layer of second material is a sacrificial layer.

13. A method as claimed in claim 1, wherein the second material is conductive.

14. A method as claimed in claim 1, wherein the nanoscale layer is deposited using atomic layer deposition.

15. A method as claimed in claim 1, wherein the thickness of the second material is less than 10 nm.

16. A method as claimed in claim 1, wherein the thickness of the second material is controlled to a tolerance of less than 1 nm.

17. A method as claimed in claim 1, wherein the third material is deposited using either vapor-liquid-solid growth or electro-deposition.

18. A method as claimed in claim 1, further comprising depositing the third material so that it extends beyond the channels and forms a continuous layer connected to multiple channels.

* * * * *